United States Patent [19]
Carlson

[11] 3,774,053
[45] Nov. 20, 1973

[54] CLAMPING ARRANGEMENT FOR REDUCING THE EFFECTS OF NOISE IN FIELD EFFECT TRANSISTOR LOGIC CIRCUITS

[75] Inventor: Robert G. Carlson, Anaheim, Calif.

[73] Assignee: North American Rockwell Corporation, El Segundo, Calif.

[22] Filed: Dec. 17, 1971

[21] Appl. No.: 209,464

[52] U.S. Cl. .................................. 307/237, 307/304
[51] Int. Cl. ............................................. H03k 5/08
[58] Field of Search .................... 307/237, 205, 251, 307/279, 304

[56] References Cited

UNITED STATES PATENTS

| | | | |
|---|---|---|---|
| 3,612,908 | 10/1971 | Heimbigner | 307/279 |
| 3,585,408 | 6/1971 | Christensen | 307/304 |
| 3,631,267 | 12/1971 | Heimbigner | 307/237 |
| 3,629,618 | 12/1971 | Fujimoto | 307/304 |
| 3,506,851 | 4/1970 | Polkinghorn | 307/304 |

*Primary Examiner*—John W. Huckert
*Assistant Examiner*—R. E. Hart
*Attorney*—L. Lee Humphries et al.

[57] ABSTRACT

A field effect transistor logic circuit includes two series-connected field effect transistors forming a shunt path connected between an input node on which noise voltage levels may appear and a reference voltage level. Conduction of one transistor is controlled by a recurring clock signal while the other transistor is rendered conductive by precharge circuitry responsive to the logic level of the input voltage at the input node. For an input voltage having a logic level corresponding to the reference voltage level (e.g., electrical ground), both transistors in the shunt path are rendered conductive and any noise on the input node is shunted to the reference voltage level. Overall circuit operation is controlled by two, double-width clock signals having a phase separation therebetween.

4 Claims, 2 Drawing Figures

INVENTOR
ROBERT G. CARLSON

BY Robert G. Rogers
ATTORNEY

CLAMPING ARRANGEMENT FOR REDUCING THE EFFECTS OF NOISE IN FIELD EFFECT TRANSISTOR LOGIC CIRCUITS

BACKGROUND OF THE INVENTION

1. Field of the Invention

This invention relates generally to clamping circuits and, more particularly, to improved clamping arrangements for reducing the effects of noise in field effect transistor logic circuits.

2. Description of Prior Art

Field effect transistor logic systems are hampered by noise which is fedback across interelectrode capacitance, or coupled from capacitance between cross-over conductors, etc. Ordinarily, in such a system, a circuit node may be connected to provide input signals to one or more output logic gates or other logic circuits. An input voltage level representing a first or second logic state may be applied to the node with the node then isolated so as to float at the input voltage level. The input logic state is subsequently evaluated by one or more of the output logic gates connected to the floating node. If noise is fedback or otherwise coupled to the floating node, the input voltage level thereon may be changed from level representing, for example, a second logic state to one logic state to another. For example, if the input voltage level is false e.g., electrical ground, and the noise which is fedback is substantially negative, the input voltage level on the node may erroneously change from false to true.

One solution to this noise problem has been to connect a relatively large capacitance at each node where noise levels may arise. As a result, charge contributed by the fedback or coupled noise voltage level is small relative to the charge on the capacitor. Such capacitances are required to be relatively large and for that reason are not desirable for microelectronic circuitry.

U.S. Pat. No. 3,518,451 to R. K. Booher, June 30, 1970 for A Gating System for Reducing the Effects of Negative Feedback Noise in Multiphase Gating Devices Illustrates one type of circuit operation which can be used in certain applications to eliminate negative noise. In effect, the solution described in the patent requires the use of one additional phase interval interposed in an operating cycle for precharging the feedback capacitance. U.S. Pat. No. 3,567,968, to Robert K. Booher, Mar. 2, 1971, for A Gating System for Reducing the Effects of Positive Feedback Noise in Multiphase Gating Devices illustrates an example of a clamping circuit for reducing positive feedback noise. A capacitor is precharged to a first voltage level for enabling a clamping field effect transistor to turn on and connect an output node to a negative voltage level for overcoming the effects of positive feedback.

A noise clamp is desired which is relatively small and which can reduce particularly negative noise voltage levels for improving the operation of a field effect transistor circuit. The present invention provides such a noise clamp.

BRIEF SUMMARY OF THE INVENTION

The present invention resides in a novel, relatively small clamping arrangement for field effect transistor logic circuits which reduces the effect of noise voltage levels without increasing chip size or degrading the operational speed of the circuit and which does not require large compensating capacitances at circuit nodes exhibiting noise levels. The clamping arrangement provides a driven shunt path between a circuit node and a reference voltage level for clamping the circuit node to the reference level during certain intervals of an operating cycle, thereby shunting any noise at the node to the reference level.

For these purposes, the preferred embodiment of the invention comprises first and second field effect transistors connected in a series shunt path between a circuit node and reference voltage level. During the course of an operating cycle, a field effect transitor precharge transistor, controlled by voltage at the circuit node, renders the first field effect transistor either nonconductive, if a first voltage level is present at the circuit node, or conductive, if a second voltage level is present. The second field effect transistor is rendered conductive each cycle by a recurring clock signal. When both first and second field effect transistors are conductive, the shunt path is completed to clamp the circuit node to the reference voltage level.

The circuit operating cycle is established by first and second clock signals with a phase separation therebetween. The first clock signal provides first and second operating intervals followed by an inbetween interval afforded by the phase separation and at least a third interval provided by the second clock signal. The circuit node, situated between input and output logic circuits, is precharged and conditionally discharged during the first and second intervals, respectively. The gate electrode of the first shunt field effect transistor is also precharged and is subsequently conditionally discharged through a precharge field effect transistor during the inbetween interval depending upon the voltage level previously established at the circuit node, the control electrode of the precharge field effect transistor being connected to the circuit node.

In a preferred form, an additional precharge field effect transistor is provided for precharging the gate electrode of the first field effect transistor. The first clock signal, connected to each precharge field effect transistor, provides both charging and discharging levels for the gate electrode of the first field effect transistor and additionally provides the reference voltage level for the shunt path. The second clock signal controls conduction of the second field effect transistor in the shunt path.

Other objects and advantages will be apparent from the following description taken in conjunction with the accompanying drawings.

DESCRIPTION OF THE PREFERRED EMBODIMENT

Figure 1:
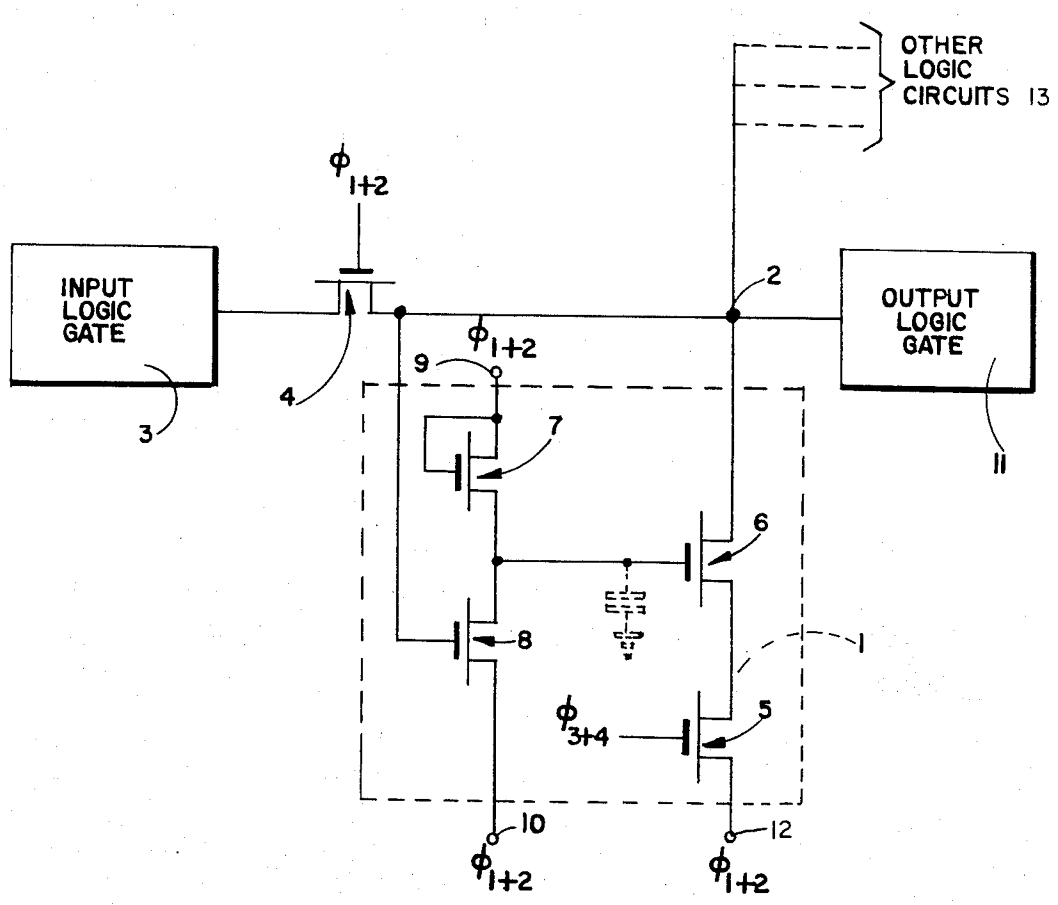
FIG. 1 is a circuit diagram of one embodiment of the clamping circuit connected to a circuit node between an input logic gate and output logic gates.

FIG. 1 illustrates clamping circuit 1 connected to input node 2 on which noise voltage levels may be fedback from output logic gates 11 connected to the input node. An example of one type of logic gate which can be connected to the input node can be seen by referring to the above-referenced patents. The input node 2 is isolated from the input logic gate 3 by isolation field effect transistor 4 having its gate electrode connected to a $\phi_{1+2}$ clock signal representing the first and second intervals of the operating cycle. During the first and second intervals, transistor 4 is conductive to connect node 2 to input logic gate 3. Thereafter, transistor 4 is rendered non-conductive to isolate the node from the input logic gate. In the usual circuit application, the isolation field effect transistor 4 is included within the input logic gate 3. In FIG. 1, it is shown separately to illustrate a floating node condition. The referenced patents may also be referred to for an example of an input logic gate. The logic gates for the input and outputs are substantially the same. The clocked cycles are usually different to enable a synchronized circuit operation.

Figure 2:
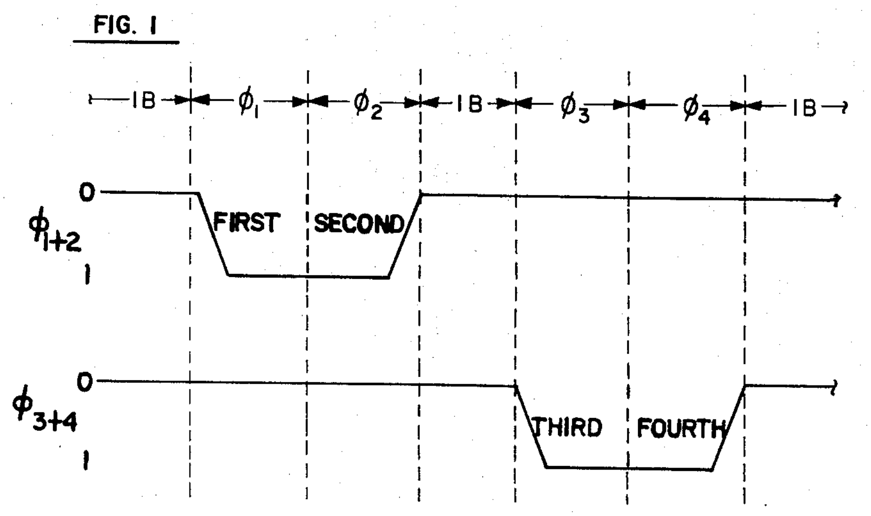
FIG. 2 is a diagram of clocking signals determining the intervals of the operating cycle for the circuit.

The operating cycle of the clamping circuit 1 may be divided into a plurality of intervals and employ clock signals as illustrated in FIG. 2. A first signal $\phi_{1+2}$ has a true (logical one) level during the previously mentioned first and second intervals, which intervals correspond to $\phi_1$ and $\phi_2$, respectively. Similarly, a second signal $\phi_{3+4}$ is true during third and fourth intervals corresponding to $\phi_3$ and $\phi_4$, respectively. The true intervals of the two signals are separated by a further or in-between interval designated IB.

The clamping circuit 1 includes a first field effect transistor 6 in electrical series with a clocked field effect transistor 5 between the input node 2 and a terminal 12. Clock signal $\phi_{1+2}$ connected to terminal 12 provides an electrical ground level (except during the first and second intervals) such that it can be used to represent a shunt (reference) voltage level. As described subsequently, the clamping circuit operates to provide a driven conductive path through transistors 5 and 6 to clamp the input node to the reference level at terminal 12 when the input voltage level on the input node corresponds to the reference level.

The gate electrode of the first field effect transistor is connected to a common point between field effect transistors 7 and 8. Field effect transistors 7 and 8 are connected between terminals 9 and 10 to which are connected in series the clock signal $\phi_{1+2}$. The gate electrode of field effect transistor 8 is connected to the input node 2 and is responsive to input voltage levels appearing on the node. The gate electrode and drain electrode of field effect transistor 7 are connected to the terminal 9. Although inherent capacitance exists at substantially all of the nodes of the field effect transistor circuits shown, only the inherent capacitance at the gate electrode of field effect transistor 6 is shown. The inherent capacitance at the gate electrode is used to store a drive voltage during the operation of the circuit as described in the following paragraphs.

In operation, the input node 2 is conditionally precharged through field effect transistor 4 to a first voltage level, e.g. –V, representing a first logic state (true) during the first operating interval $\phi_1$. Simultaneously, field effect transistor 7 is turned on so that the inherent capacitance connected to the gate electrode of field effect transistor 6 is precharged through transistor 7 to the voltage level of the $\phi_{1+2}$ clock on terminal 10. The voltage level of the $\phi_{1+2}$ clock is approximately equal to the voltage level on the input node 2.

During the second operating interval $\phi_2$, the input (not shown) to the logic gate 3 is evaluated. If the input to the logic gate is true, the voltage level on the input node 2 is discharge through transistor 4 to a second voltage level representing a second logic state (false). For P-channel devices, the second voltage level is usually electrical ground. On the other hand, the input node will remain charged to the first voltage level (true) if the input to the logic gate 3 is false. Assuming first that input node 2 is grounded by evaluation of the logic gate 3, then field effect transistor 8 is turned off by the corresponding ground level at its gate, and the inherent capacitance at the gate electrode of field effect transistor 6 remains charged at the end of $\phi_2$. On the other hand, if the input to the logic gate is false such that the input node 2 remains charged to the first voltage level, field effect transistor 8 remains on at the end of $\phi_2$. As a result, since the $\phi_{1+2}$ clock applied to terminal 10 is false (i.e. at ground level) at the end of $\phi_2$, a conduction path will exist through field effect transistor 8 to ground at terminal 10 for discharging the inherent capacitance on the gate electrode of field effect transistor 6. Thus, during interval IB following the second interval $\phi_2$, the gate electrode of transistor 6 will either discharge to ground if input node 2 is negative or will remain charged if the input node is at ground level.

During $\phi_3$, the clocked field effect transistor 5 becomes conductive by means of the $\phi_{3+4}$ clock applied to its gate electrode. The clock signal $\phi_{1+2}$ on its drain electrode is at electrical ground during $\phi_3$. Assuming that the input node 2 has been discharged to ground level, as explained above, the field effect transistor 6 is rendered conductive by the charge retained at its gate electrode such that during $\phi_3$, a driven conduction path through field effect transistors 5 and 6 is provided between the input node 2 and the electrical ground voltage level at terminal 12 provided by the $\phi_{1+2}$ clock.

During the $\phi_{3+4}$ intervals, the inputs to the output logic gate 11 and other logic circuits 13 connected to the input node are evaluated. The input voltage level on the input node 2 comprises at least one of the inputs to the logic gates. During the evaluation interval, negative noise is fedback through the interelectrode capacitance to the input node. Assuming that the voltage level at input node 2 is false (i.e., ground level), the negative noise coupled to the node could change the voltage level from the false ground level to a negative level representing a true logic state. Under those circumstances, circuit propagation errors would be produced.

However, since the field effect transistors 5 and 6 provide a driven conduction path to electrical ground at terminal 12 during the third and fourth operating intervals, if input node 2 is at ground level, any negative noise fedback to the input node 2 during these intervals is shunted to electrical ground so that the circuit operation continues unimpaired.

On the other hand, if the input voltage level on input node 2 had remained charged to a first (negative) voltage level, the field effect transistor 6 would have been held off during the third operating interval so that the conduction path would not have been provided between the input node and the ground level at terminal 12. When the input node 2 remains charged negative any negative noise simply adds to the negative voltage already existing at the input node and circuit operation is not effected.

During the following $\phi_1$ interval, the circuit operation is repeated.

It should be understood that other operating intervals can also be used. The $\phi_{1+2}$, $\phi_{3+4}$ intervals were illustrated as part of the preferred embodiment. Similarly, although the circuit was described in terms of P-channel field effect transistors responsive to negative voltage levels, other types of field effect transistors are also within the scope of the invention.

The precharge field effect transistor circuit was described as comprising field effect transistors 7 and 8. It is possible to eliminate field effect tranistor 7. Circuit speed and operation are slightly improved by the addition of field effect transistor 7. However, the charge and discharge path can be effected through field effect transistor 8. From the foregoing, it will be seen that the present invention provides a clamping arrangement for field effect transistor logic citcuits which reduces the effect of noise voltage levels in a manner which avoids the requirement for large compensating capacitances at the circuit nodes exhibiting noise levels. Moreover, the clamping arrangement is of relatively simple design which maintains a small chip size and which functions without degrading speed of circuit operation. It will also be evident that, while a preferred embodiment has been shown and described, various modifications and changes may be made without departing from the spirit and scope of the invention.

I claim

1. A clamping arrangement for use with a field effect transistor logic circuit having a circuit node at which a voltage level is to be established and at which noise voltage levels may appear during the course of an operating cycle for said logic circuit, said clamping arrangement comprising:

a first field effect transistor having source, drain, and gate electrodes with a source-to-drain conduction path controlled by a drive voltage at its gate electrode;

a second field effect transistor having source, drain, and gate electrodes with a source-to-drain conduction path controlled by a drive voltage at its gate electrode;

reference means providing a reference voltage level;

means connecting the conduction paths of said first and second field effect transistors in electrical series between said circuit node and said reference means whereby said transistors, when conductive, provide a shunt path for connecting said circuit node to said reference voltage level;

control means establishing an operating cycle for said clamping arrangement having multiple phase intervals, said control means including a first clock signal corresponding to first and second intervals and a second clock signal corresponding to at least a third interval with said first and second clock signals being separated by a phase duration providing an inbetween interval;

a precharge field effect transistor having source, drain and gate electrodes with a source-to-drain conduction path controlled by a drive voltage at its gate electrode, said precharge field effect transistor having its gate electrode connected to said circuit node and its conduction path connected between said first clock signal and the gate electrode of said first field effect transistor;

means for providing a first voltage level to said circuit node and to the gate electrode of said precharge field effect transistor during said first interval, said precharge field effect transistor being rendered conductive by said first voltage level to set the gate electrode of said first field effect transistor to a corresponding first voltage level provided by said first clock signal thereby rendering said first field effect transistor conductive;

means for either retaining the first voltage level on said circuit node during said second interval or establishing a second voltage level thereat, said precharge field effect transistor remaining conductive in response to said first voltage level but being rendered non-conductive by said second voltage level, said precharge field effect transistor, if non-conductive, serving to isolate the corresponding first voltage level on the gate electrode of said first field effect transistor to maintain said first field effect transistor conductive, and said precharge field effect transistor, if conductive, serving to connect the gate electrode of said first field effect transistor to the corresponding second voltage level assumed by said first clock signal during said inbetween interval to render said first field effect transistor non-conductive, whereby during said third interval following said inbetween interval said first field effect transistor is conductive for said second voltage at said circuit node and is non-conductive for said first voltage level at said circuit node; and said second clock signal being connected to the gate electrode of said second field effect transistor for rendering said second field effect transistor conductive at least during said third interval, whereby conduction of said first and second field effect transistors during said third interval completes said shunt path to connect said circuit node and the second voltage level thereat to a corresponding second voltage level at said reference means whereby noise voltage levels appearing at said circuit node are shunted to said reference means.

2. The clamping arrangement of claim 1 wherein said reference means comprises said first clock signal.

3. The clamping arrangement of claim 1 including an additional field effect transistor having source, drain, and gate electrodes with a source-to-drain conduction path controlled by a drive voltage at its gate electrode, said additional field effect transistor having its conduction path connected between said first clock signal and the gate electrode of said first field effect transistor, and said first clock signal further being connected to the gate electrode of said additional field effect transistor.

4. The clamping arrangement of claim 3 wherein said reference means comprises said first clock signal.

* * * * *

PO-1050
(5/69)

UNITED STATES PATENT OFFICE
CERTIFICATE OF CORRECTION

Patent No. 3,774,053 Dated November 20, 1973

Inventor(s) Robert G. Carlson

It is certified that error appears in the above-identified patent and that said Letters Patent are hereby corrected as shown below:

line 25, delete "level representing, for example, a second logic".

line 26, before "one", delete "state to" (first occurrence).

Column 2, line 40, change "connected" to --supplied--.

Column 3, line 65, change "discharge" to --discharged--.

Column 4, line 9, after "gate" insert --3--.

Column 5, line 11, change "citcuits" to --circuits--.

line 44, change "control" to --clock--.

line 46, change "control" to --clock--.

line 46, change "including" to --providing--.

line 57, after "between" insert --a terminal receiving--.

Column 6, line 24, after "to" insert --said terminal receiving said first clock signal with--.

line 26, after "terval" insert --serving--.

PO-1050
(5/69)

UNITED STATES PATENT OFFICE
CERTIFICATE OF CORRECTION

Patent No. 3,774,053 Dated November 20, 1973

Inventor(s) Robert G. Carlson

It is certified that error appears in the above-identified patent and that said Letters Patent are hereby corrected as shown below:

Column 6, line 29, after "voltage" insert --level--.

line 32, change "connected" to --supplied--.

line 51, after "between" and before "said" insert --a terminal receiving--.

line 53, change "connected" to --supplied--.

Signed and sealed this 10th day of September 1974.

(SEAL)
Attest:

McCOY M. GIBSON, JR.
Attesting Officer

C. MARSHALL DANN
Commissioner of Patents